(12) United States Patent
Erath

(10) Patent No.: US 11,537,052 B2
(45) Date of Patent: Dec. 27, 2022

(54) WEIGHT-FORCE COMPENSATION DEVICE

(71) Applicant: Carl Zeiss SMT GmbH, Oberkochen (DE)

(72) Inventor: Michael Erath, Dietenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 444 days.

(21) Appl. No.: 16/748,119

(22) Filed: Jan. 21, 2020

(65) Prior Publication Data

US 2020/0159131 A1 May 21, 2020

Related U.S. Application Data

(63) Continuation of application No. PCT/EP2018/067583, filed on Jun. 29, 2018.

(30) Foreign Application Priority Data

Jul. 25, 2017 (DE) .......................... 102017212773.2

(51) Int. Cl.
*G03F 7/20* (2006.01)
*F16C 32/04* (2006.01)
*G02B 7/182* (2021.01)

(52) U.S. Cl.
CPC ...... *G03F 7/70825* (2013.01); *F16C 32/0417* (2013.01); *F16C 32/0427* (2013.01); *F16C 32/0434* (2013.01); *G02B 7/182* (2013.01)

(58) Field of Classification Search
CPC ............ G03F 7/70825; G03F 7/70141; G03F 7/70258; F16C 32/0417; F16C 32/0427; F16C 32/0434; G02B 7/182

(Continued)

(56) References Cited

U.S. PATENT DOCUMENTS 8,902,031 B2 12/2014 Compter et al.
9,448,384 B2 9/2016 Erath et al.
(Continued)

FOREIGN PATENT DOCUMENTS

CN 101206410 A 6/2008
CN 104471485 A 3/2015
(Continued)

OTHER PUBLICATIONS

Translation of German Office Action for corresponding Appl No. 10 2017 212 773.2, dated Nov. 4, 2018.
(Continued)

*Primary Examiner* — Ahmed Elnakib
(74) *Attorney, Agent, or Firm* — Fish & Richardson P.C.

(57) ABSTRACT

A weight compensating device includes a stator and a translator. The translator is movable relative to the stator along a movement axis. The translator includes a first permanent magnet arrangement with an axial magnetization. The stator includes a second permanent magnet arrangement radially surrounding the first permanent magnet arrangement. The stator includes a third permanent magnet arrangement that is coaxially below the first permanent magnet arrangement and that has an axial magnetization aligned in inverse fashion with respect to the axial magnetization of the first permanent magnet arrangement. The stator includes a magnetic body arrangement that is coaxially above the first permanent magnet arrangement. The first permanent magnet arrangement, the second permanent magnet arrangement, the third permanent magnet arrangement and the magnetic body arrangement form a magnetic unit and, in interaction with one another, form a compensating force that counteracts the weight acting on the translator.

20 Claims, 6 Drawing Sheets

(58) Field of Classification Search
USPC .......................................... 248/489; 310/90.5
See application file for complete search history.

(56) References Cited

U.S. PATENT DOCUMENTS

| | | | |
|---|---|---|---|
| 9,519,230 | B2 | 12/2016 | Boon |
| 2016/0216611 | A1* | 7/2016 | Nefzi ................... F16C 32/0417 |
| 2018/0284626 | A1* | 10/2018 | Erath ................... G03F 7/70141 |
| 2019/0361362 | A1* | 11/2019 | Wesselingh ......... G03F 7/70808 |
| 2020/0159131 | A1* | 5/2020 | Erath ................... G03F 7/70825 |
| 2021/0223705 | A1* | 7/2021 | Pnini ................... G03F 7/70758 |
| 2021/0389681 | A1* | 12/2021 | Pnini-Mittler ...... G03F 7/70825 |

FOREIGN PATENT DOCUMENTS

| | | |
|---|---|---|
| CN | 106997155 A | 8/2017 |
| DE | 10 2010 027 954 A1 | 10/2011 |
| DE | 10 2011 088 735 A1 | 6/2012 |
| DE | 10 2013 209 028 A1 | 5/2014 |
| DE | 102013209028 * | 5/2014 |
| DE | 10 2015 220 498 A1 | 12/2015 |
| DE | 102015220498 * | 12/2015 |
| DE | 10 2015 201 096 A1 | 7/2016 |
| EP | 1 001 512 A2 | 5/2000 |
| JP | 2006040927 A | 2/2006 |
| WO | WO 2005/026801 A2 | 3/2005 |
| WO | WO 2006/087463 A1 | 8/2006 |
| WO | WO 2016/116375 A1 | 7/2016 |

OTHER PUBLICATIONS

Translation of International Search Report for corresponding Appl No. PCT/EP2018/067583, dated Nov. 7, 2018.
Chinese Office Action, with translation thereof, for corresponding CN Appl No. 201880061505.5, dated Apr. 8, 2022.

* cited by examiner

WEIGHT-FORCE COMPENSATION DEVICE

CROSS-REFERENCE TO RELATED APPLICATIONS

The present application is a continuation of, and claims benefit under 35 USC 120 to, international application PCT/EP2018/067583, filed Jun. 29, 2018, which claims benefit under 35 USC 119 of German Application No. 10 2017 212 773.2, filed Jul. 25, 2017. The entire disclosure of these applications are incorporated by reference herein.

FIELD

The disclosure relates to a weight compensating device that includes a stator and a translator. Moreover, the disclosure relates to a projection exposure apparatus for semiconductor lithography, including an illumination system including a radiation source and an optical unit including at least one optical element.

BACKGROUND

In projection exposure apparatuses for semiconductor lithography, a multiplicity of actuators, for example plunger coil actuators, are usually used in order to mechanically influence, manipulate and/or deform components, in particular optical elements in the illumination system of the projection exposure apparatuses, in order for example to control the beam path of a radiation source.

WO 2005/026801 A2 discloses adjusting optical elements for EUV projection exposure apparatuses, such as mirrors, using drivable movement axes via actuating facilities in the form of Lorentz actuators in a plurality of degrees of freedom. Plunger coil actuators can be used for this purpose, wherein a linearly movable actuating element, a translator, can be moved by electromagnetic interaction with a statically mounted coil surrounding the translator. In this case, the translator is connected via a guide member to the optical element to which a movement carried out is transmitted.

It can be advantageous if the actuators for adjusting the optical elements and the optical elements themselves are relatively decoupled from weight forces. It can be preferable for the actuators to adjust the optical elements in the weight-free or apparently force-free state. To this end, use is usually made of so-called weight or gravity compensating devices on the basis of permanent magnets ("magnetic gravity compensators"), which take up the weight—at least a large part of the weight—of the optical elements. As a result, the actuation of the optical elements by the actuators is simplified and a lower energy input into the actuators is involved. This in turn has positive effects on the overall behavior of the projection exposure apparatus, since for example no additional thermal loads on account of the high energy consumption of the actuators are introduced into the installation.

Such a weight compensating device is described in DE 10 2011 088 735 A1, for example, and it includes a housing coupled to support arms and a holding element that is movable in relation to the housing and coupled to a mirror. By way of example, two ring magnets are arranged on the movable holding element; together with a ring magnet securely arranged on the housing and radially surrounding the two ring magnets, said two ring magnets generate a compensating force that counters the weight of the mirror. The ring magnet arranged on the housing has a radial magnetization. Consequently, the compensating force generated by the ring magnets in combination can counteract the weight of an optical component, more particularly an optical device of a projection exposure apparatus, or substantially correspond thereto in terms of magnitude.

On account of the advancing miniaturization of semiconductor circuits, the desired properties for resolution and accuracy of projection exposure apparatuses are equally increasing. Correspondingly high demands are also placed on the actuators that mechanically control the optical elements in the illumination system, on the sensor system and on the control electronics.

What can be a particular issue when using weight compensating devices in this case is that the magnetic circuits thereof generate a relatively large stray field, leading to unwanted electromagnetic crosstalk with other components. By way of example, soft magnetic parts, for example iron parts, present in the projection exposure apparatus can modify the behavior of the weight compensating devices. Further, employed sensors can be influenced by the generated stray fields in bothersome fashion. In particular, the effects caused in parasitic fashion or the stray fields become ever more pronounced on account of the ever higher demands on the power of the weight compensating devices, which are caused by ever larger and heavier optical elements such as mirrors, for example.

Minimizing the stray fields by soft magnetic shields is known from practice. However, this can simultaneously generate unwanted hysteresis effects in the weight compensating device or the response behavior of the weight compensating device and/or the actuators combined therewith is impaired.

Further, reducing the stray field by using further permanent magnets is known from practice. However, the solutions known to this end can be complicated from a manufacturing point of view and can involve a great number of additional permanent magnets in order to achieve sufficiently good shielding. Consequently, for example, a number of permanent magnets that has been increased by a factor of 3 may become involved, as a result of which the complexity of the system is significantly increased.

A further issue with known weight compensating devices can be that there is great production complexity in making the radially magnetized permanent magnetic rings. Typically, the usual number of ring magnets can only be produced by the use of a multiplicity of axially magnetized ring segments, which are subsequently assembled by being placed next to one another and adhesively bonded to form a circumferential ring. In order to achieve a sufficiently high quality of such a "ring magnet", the demands on the process tolerances are generally very high; moreover, it is usually desirable for the ring segments to be as small as achievable.

SUMMARY

The present disclosure seeks to provide a weight compensating device which has a relatively simple structure and a relative small stray field.

The disclosure also seeks to provide a projection exposure apparatus for semiconductor lithography including weight compensating devices, the stray field of which is relatively small.

In a general aspect, the disclosure provides a weight compensating device including a stator and a translator. The translator is movable relative to the stator along a movement axis. The translator includes a first permanent magnet arrangement with an axial magnetization. The stator includes a second permanent magnet arrangement that radially surrounds the first permanent magnet arrangement. The stator includes a third permanent magnet arrangement that is arranged coaxially below the first permanent magnet arrangement and that has an axial magnetization that is aligned in inverse fashion with respect to the axial magnetization of the first permanent magnet arrangement. The stator includes a magnetic body arrangement that is arranged coaxially above the first permanent magnet arrangement. The first permanent magnet arrangement, the second permanent magnet arrangement, the third permanent magnet arrangement and the magnetic body arrangement form a magnetic unit and, in interaction with one another, form a compensating force that counteracts the weight acting on the translator.

The weight compensating device according to the disclosure includes a stator and a translator, with the translator being movable relative to the stator along a movement axis.

The translator can be the actuating element of a linear motor, for example of a Lorentz actuator in the form of a plunger coil actuator. However, provision can be made for the translator only to be used for the weight-free mounting of a component and for said translator to be kept to this end in virtually a freely suspended manner in the optimum case in a central position or zero position along the movement axis. In principle, the translator can have any structure. Typically, the translator will have a straight portion or a portion with a linear extent. Such a configuration is particularly suitable for transmitting or taking up forces. The translator can have a hollow or tube-shaped embodiment in order to save additional weight. Preferably, the longitudinal axis of the translator can extend coaxially with the movement axis.

The weight compensating device is preferably embodied for weight-free or substantially weight-free mounting of a component. The component can be, for example, an optical element, in particular a lens element or a mirror of a projection exposure apparatus. However, the disclosure is not restricted thereto. Any desired component can be mounted using the solution according to the disclosure.

According to the disclosure, provision is made for the translator to include a first permanent magnet arrangement with an axial magnetization and for the stator to include a second permanent magnet arrangement that radially surrounds the first permanent magnet arrangement.

An axial magnetization is intended to mean that the polarization or the alignment of the magnetic poles of individual magnetic component parts or permanent magnets of the permanent magnet arrangement extends in axially parallel fashion with respect to the movement axis or longitudinal axis of the translator. That is to say, a respective connecting line between a first magnetic pole and a second magnetic pole of permanent magnets of the permanent magnet arrangement extends in axially parallel fashion with respect to the movement axis.

According to the disclosure, provision is further made for the stator to include a third permanent magnet arrangement that is arranged coaxially below the first permanent magnet arrangement and that has an axial magnetization that is aligned in inverse fashion with respect to the axial magnetization of the first permanent magnet arrangement.

A position below the first permanent magnet arrangement means an axial position along the movement axis that, along the direction of the weight, is situated further away from the component whose weight should be compensated than the first permanent magnet arrangement. That is to say, the third permanent magnet arrangement is situated on the side of the first permanent magnet arrangement that faces away from the component whose weight should be compensated. Consequently, the third permanent magnet arrangement is arranged closer to a center of the source of gravity, in particular the center of the Earth.

The terms "above"/"over"/"top", etc., and "below"/"under"/"bottom", etc., used in the disclosure should be understood in accordance with the definition above.

An axial magnetization of the third permanent magnet arrangement that is aligned in inverse fashion with respect to the axial magnetization of the first permanent magnet arrangement means that axially polarized individual magnetic component parts or permanent magnets of the respective permanent magnet arrangements are aligned opposite to one another. That is to say, the first permanent magnet arrangement and the third permanent magnet arrangement are axially magnetized in such a way that the two permanent magnet arrangements magnetically repel one another.

To the extent that the first permanent magnet arrangement and the third permanent magnet arrangement are each only formed by an axially magnetized permanent magnet, the permanent magnets are arranged in such a way that these repel one another, i.e., that the permanent magnets of the two permanent magnet arrangements are arranged in such a way that the same poles are aligned to one another, for example a magnetic north pole of the first permanent magnet arrangement lies opposite a magnetic north pole of the third permanent magnet arrangement. If the permanent magnet arrangements are each formed by a plurality of permanent magnets, for example by a plurality of ring magnets, the two permanent magnet arrangements are preferably matched to one another in such a way that permanent magnets or ring magnets aligned toward one another in each case with the same polarity lie opposite one another and consequently repel one another. However, overall it may already be sufficient if the permanent magnets or the ring magnets are assembled in such a way that this yields a repelling force overall between the two permanent magnet arrangements, with it naturally being preferable for all individual magnetic component parts of the two permanent magnet arrangements to also repel one another and correspondingly have an alignment with an inverse polarization or magnetization.

According to the disclosure, provision is further made for the stator to include a magnetic body arrangement that is arranged coaxially above the first permanent magnet arrangement.

A magnetic body can be a permanent magnet, a magnetizable part, e.g. a soft iron, or a magnetic part that reacts magnetically under the influence of a magnet. The magnetic body arrangement may also be one or more electromagnets and/or electropermanent magnets.

Provision is made for the magnetic body arrangement and the first permanent magnet arrangement to interact in such a way that a magnetic attractive force acts on both parts by way of a magnetic field.

An arrangement above the first permanent magnet arrangement means a position along the movement axis that is situated closer to the component whose weight should be compensated than the first permanent magnet arrangement. That is to say, the magnetic body arrangement is situated on the side of the first permanent magnet arrangement that faces the component whose weight should be compensated or the magnetic body arrangement is consequently arranged along the movement axis at an axial position that is further away from the center of the gravitational field, in particular the center of the Earth, than the first permanent magnet arrangement.

Consequently, the first permanent magnet arrangement is situated between the third permanent magnet arrangement and the magnetic body arrangement along the movement axis (in the axial direction).

In addition to the first permanent magnet arrangement and the translator, the second permanent magnet arrangement can also radially surround the third permanent magnet arrangement and/or the magnetic body arrangement in part or in full.

According to the disclosure, provision is made for the first permanent magnet arrangement, the second permanent magnet arrangement, the third permanent magnet arrangement and the magnetic body arrangement to form a magnetic unit and, in interaction with one another, form a compensating force that counteracts the weight acting on the translator.

Consequently, the weight compensating device can be used via the translator to take up or partly take up the weight of a component by way of the compensating force and, where applicable, also to align the component if an actuator is additionally provided. To this end, the translator is mechanically connected to the component along the movement axis or at the end of the movement axis. Consequently, the weight of the component acts downward along the movement axis, i.e., in the direction toward the third permanent magnet arrangement, while the compensating force counteracts the weight, i.e., acts upward along the movement axis.

In addition to the weight of the component, the weight compensating device can also compensate for or take up the weight of component parts connected to the component, for example parts of an actuator system or of the weight compensating device itself.

The weight compensating device according to the disclosure is suitable for weight compensation for virtually any applications. However, the weight compensating device can be used particularly preferably within a projection exposure apparatus for semiconductor lithography and very particularly preferably for an EUV projection exposure apparatus.

In the present case, a compensating force should be understood to mean a force that substantially acts counter to the weight of the component and that preferably substantially corresponds to the weight in terms of absolute value in such a way that the compensating force relatively completely compensates the weight, as a result of which the component can be mounted substantially without weight along the movement axis and can be moved where desired.

A permanent magnet arrangement should be understood to mean an arrangement including one or more permanent magnets.

In addition to the first, second and/or third permanent magnet arrangement and/or the magnetic body arrangement, further permanent magnet arrangements and/or magnetic body arrangements may also be provided, which together generate the compensating force.

Further, further magnetic units including the aforementioned permanent magnet arrangements and the magnetic body arrangement may be provided, which together form the compensating force.

The inventors have recognized that a structure including at least one magnetic unit embodied according to the disclosure generates a significantly smaller stray field than was previously achievable using the known systems. At the same time, a compact design, i.e., small installation volume, can be maintained since only a few permanent magnets are involved.

A further advantage of a reduced stray field lies in an increase in the performance of the weight compensating device since the losses of the magnetic circuit are reduced.

As a result of the combination according to the disclosure of a first, second and third permanent magnet arrangement with the magnetic body arrangement, it is possible to improve the characteristic of the weight compensating device by superposing two opposing stiffnesses.

Since only the first permanent magnet arrangement is arranged on the translator, i.e., the movable unit of the weight compensating device, the masses to be moved are comparatively low. This can be particularly advantageous if an actuator system is simultaneously provided on the weight compensating device, said actuator system intending to cause fast movements of the translator along the movement axis in particular. Then, the inertia of the translator can be particularly advantageous, i.e., low.

As a result of magnetic shielding being substantially achieved by the use of permanent magnets, a virtually hysteresis-free response behavior of the weight compensating device or of an actuator with a weight compensating device equipped according to the disclosure is expected.

Since preferably all permanent magnet arrangements, but at least the first and the third permanent magnet arrangement, have axially magnetized permanent magnets or are embodied as axially magnetized permanent magnet arrangements, the technical and economic outlay for manufacturing the permanent magnet arrangements and for ultimately manufacturing the weight compensating device is comparatively low.

As a matter of principle, the solution according to the disclosure allows the first, the second and third permanent magnet arrangement and also the magnetic body arrangement to be embodied by axially magnetized permanent magnets. In comparison with systems, in which at least the second permanent magnet arrangement on the stator, which surrounds the first permanent magnet arrangement, was formed by a radially polarized ring magnet, i.e., the inner side of which was formed by a first magnetic pole and the outer side of which was formed by a second magnetic pole, this is comparatively small. An assembly from a multiplicity of radial or "cake-shaped" individual segments, which in each case all had to be magnetized in the axial direction thereof, can thus be dispensed with.

Preferably, a rotationally symmetric magnetic circuit or rotationally symmetric magnetic unit is provided for compensating weight, wherein the rotational axis corresponds to the longitudinal axis of the translator or the movement axis.

In one development of the disclosure, provision can be made for the magnetic body arrangement to be embodied as a fourth permanent magnet arrangement, which has an axial magnetization that is aligned in accordance with the axial magnetization of the first permanent magnet arrangement.

An axial magnetization corresponding to the first permanent magnet arrangement means that axially polarized individual component parts or permanent magnets of the fourth permanent magnet arrangement are aligned with opposite polarity with respect to corresponding individual component parts or permanent magnets of the first permanent magnet arrangement such that the magnetic poles thereof magnetically attract. Provision is made for the fourth permanent magnet arrangement and the first permanent magnet arrangement to magnetically attract one another. To the extent that each of the first permanent magnet arrangement and the magnetic body arrangement, in their embodiment as fourth permanent magnet arrangement, includes only one permanent magnet, their poles are aligned with respect to one another in such a way that the first permanent magnet arrangement and the fourth permanent magnet arrangement attract. To the extent that the permanent magnet arrangements are each formed by a plurality of permanent magnets, it is advantageous if the permanent magnets are each arranged in such a way that the individual permanent magnets of the first permanent magnet arrangement and the permanent magnets of the fourth permanent magnet arrangement each attract appropriately. However, it may also be sufficient for the permanent magnets to be arranged and polarized in such a way that the first permanent magnet arrangement and the fourth permanent magnet arrangement overall attract, this however not applying to all permanent magnets of the two permanent magnet arrangements.

According to the disclosure, the magnetic body arrangement may also be, e.g., a soft magnetic material, for example iron. In this case, too, the magnetic body arrangement of the stator and the first permanent magnet arrangement of the translator would magnetically attract.

The inventors have recognized that the force-distance curve is improved, i.e., has a flatter profile, if use is made of a fourth permanent magnet arrangement. Consequently, the compensating force can be constant or at least substantially constant in the case of a movement or a deflection of the translator along the movement axis. Therefore, it is preferable for the magnetic body arrangement also to be formed as a permanent magnet arrangement, i.e., as a fourth permanent magnet arrangement in the present case.

Moreover, the inventors have recognized that the magnetic shielding can be still further improved if use is made of a fourth permanent magnet arrangement while, at the same time, the response behavior of the weight compensating device or a weight compensating device equipped with an actuator is even better.

It is conceivable to completely dispense with a magnetic body arrangement or the fourth permanent magnet arrangement. However, the force-distance curve arising from such an arrangement is not particularly advantageously suitable for weight compensation.

Preferably, the stiffness or the derivative of the force-distance curve of the weight compensating device can be less than 20 N/mm, particularly preferably much less than 20 N/mm, and very particularly preferably at least approximately 0 N/mm, ideally 0 N/mm.

In one development of the disclosure, provision can moreover be made for the first permanent magnet arrangement, the third permanent magnet arrangement and the magnetic body arrangement to extend in a respective radial plane in a manner orthogonal and symmetric with respect to the movement axis.

The permanent magnet arrangements and the magnetic body arrangement can consequently be aligned in plane-parallel fashion with respect to one another or extend in plane-parallel fashion with respect to one another.

In one development of the disclosure, provision can moreover be made for the first permanent magnet arrangement, the third permanent magnet arrangement and/or the fourth permanent magnet arrangement to each be formed from at least one axially magnetized ring magnet.

An embodiment of the permanent magnet arrangement(s) of at least one axially magnetized ring magnet is particularly suitable since this yields a uniform or rotationally symmetric magnetic field and, moreover, ring magnets are particularly well suited to centrally receive or engage around a translator.

Although the permanent magnet arrangements are preferably embodied as ring magnets, they can also be embodied in a different way. By way of example, provision can be made of an axially magnetized permanent magnet with a rectangular cross-section and a central bore or polygonal cutout, for example for receiving the translator. Provision can also be made for a plurality of bar magnets that are magnetized axially along the movement axis to be arranged around the movement axis in ring-shaped fashion. Provision can also be made for the permanent magnet arrangements to have different embodiments; however, the same types of axially magnetized permanent magnets are preferably used.

In one development of the disclosure, provision can moreover be made for the first permanent magnet arrangement, the third permanent magnet arrangement and/or the magnetic body arrangement (or the fourth permanent magnet arrangement) to each be formed from a plurality of nested axially magnetized ring magnets.

Use can be made of axially magnetized ring magnets with different radii or diameters. By way of example, the nested ring magnets of a permanent magnet arrangement can be fastened to one another in interlocking, force-fit and/or cohesive fashion. Preferably, the adjacent axially magnetized ring magnets of at least one of the permanent magnet arrangements or of the magnetic body arrangement are adhesively bonded to one another. Provision can also be made for the inner or outer surfaces of the ring magnets not to directly rest against one another but to be spaced apart from one another by further components. However, the nested adjacent ring magnets preferably rest against one another.

Provision can be made for the nested axially magnetized ring magnets of at least one of the permanent magnet arrangements or of the magnetic body arrangement to have an identical cross-sectional area and, in terms of their geometry, to merely differ in terms of their outer radius and inner radius. Preferably, all ring magnets of the first permanent magnet arrangement, the third permanent magnet arrangement and the magnetic body arrangement have an identical cross-sectional area.

In one development of the disclosure, provision can be made for the adjacent and nested ring magnets of at least one of the permanent magnet arrangements or of the magnetic body arrangement to be polarized with axially opposite polarity in each case.

That is to say, the axial alignment of the magnetic poles of adjacent axially magnetized ring magnets of the respective permanent magnet arrangement can preferably be interchanged in each case. Preferably, all ring magnets of the first permanent magnet arrangement, of the third permanent magnet arrangement and of the magnetic body arrangement are respectively correspondingly polarized with axially opposite polarity in relation to their adjacent ring magnets.

In one development of the disclosure, provision can further be made for the nested ring magnets of a respective permanent magnet arrangement and/or of the magnetic body arrangement to be respectively arranged in the same radial plane in a manner orthogonal and symmetric with respect to the movement axis.

Preferably, the ring magnets of the respective permanent magnet arrangement or of the magnetic body arrangement each have the same axial height. The nested ring magnets of a permanent magnet arrangement or of the magnetic body arrangement can accordingly form two common coplanar end-side surfaces.

In one preferred development of the disclosure, provision can be made for the first permanent magnet arrangement, the third permanent magnet arrangement and/or the magnetic body arrangement to include identical sets of ring magnets, wherein the ring magnets of the first permanent magnet arrangement, the ring magnets of the third permanent magnet arrangement and the magnetic body arrangement or the ring magnets of the magnetic body arrangement are identically arranged in each case and the central axes thereof in each case extend coaxially with respect to the movement direction or the longitudinal axis of the translator.

By way of example, if three ring magnets are provided in the first permanent magnet arrangement, it is preferable for three ring magnets likewise to be provided in the third permanent magnet arrangement and, where applicable, in the magnetic body arrangement. Particularly preferably, the dimensions and/or the structure and/or the number of the ring magnets of the permanent magnet arrangement or of the magnetic body arrangement are identical, which, in particular, can improve the production costs and the magnetic response behavior.

Preferably, the sets of ring magnets of the permanent magnet arrangements or of the magnetic body arrangement also have an identical arrangement in each case, preferably having an arrangement that is symmetric around the translator in such a way that the central axes of the respective ring magnets extend coaxially with respect to the axis of the translator or the movement axis. Here, it is advantageous if the permanent magnet arrangements formed by the sets of ring magnets and the magnetic body arrangement have an identical structure and are arranged around the translator. Here, the ring magnets of the permanent magnet arrangements or of the magnetic body arrangement can be arranged in a mirrored fashion, in such a way that respectively identical ring magnets are arranged above and below one another in the axial direction, said ring magnets possibly only differing in terms of a different axial polarization. Here, the axial polarization is selected in a manner described as advantageous both above and below with respect to the permanent magnet arrangements or the magnetic body arrangement. Otherwise, the ring magnets of the permanent magnet arrangements or of the magnetic body arrangement arranged above and below one another in the axial direction each have an identical embodiment and positioning.

In one development, provision can be made for in each case two to ten ring magnets, preferably three to five ring magnets, particularly preferably three ring magnets to be provided for forming the first permanent magnet arrangement, the third permanent magnet arrangement and/or the magnetic body arrangement.

By way of example, if use is made of three ring magnets for forming the first permanent magnet arrangement, provision can be made for a radially innermost ring magnet to have an axial magnetization such that a first magnetic pole is formed at the bottom of the ring magnet along the movement axis and a second magnetic pole is formed at the top of the ring magnet along the movement axis. To simplify things, the first magnetic pole is referred to as north pole below and the second magnetic pole is referred to as south pole below. However, the labels can also be interchanged, according to which the first magnetic pole is embodied as a south pole and the second magnetic pole is embodied as a north pole.

Finally, provision can be made for a central ring magnet of the first permanent magnet arrangement to have an opposite polarization with respect to the innermost ring magnet, according to which the south pole is arranged at the bottom in the movement direction and the north pole is arranged at the top in the movement direction. A radially outermost ring magnet of the first permanent magnet arrangement can, in turn, have an opposite polarization thereto. Consequently, the three nested ring magnets overall form the axial magnetization of the first permanent magnet arrangement by way of their respective magnetic polarizations. To this end, the third permanent magnet arrangement has an inverse magnetization according to the disclosure. Accordingly, a radially innermost ring magnet of the third permanent magnet arrangement may have a south pole, which is arranged lower down in the movement direction, and have a north pole, which is arranged further up along the movement axis. A central ring magnet of the third permanent magnet arrangement can, in turn, have an opposite alignment thereto. Finally, a radially outermost ring magnet of the third permanent magnet arrangement can again be aligned opposite to the central ring magnet of the third permanent magnetic arrangement or in a manner corresponding to the radially innermost ring magnet of the third permanent magnet arrangement.

The use of three ring magnets in the first permanent magnet arrangement, the third permanent magnet arrangement and, optionally, in the magnetic body arrangement was found to be particularly suitable for generating a very small stray field, with the manufacturing outlay and the masses that are attached to the translator and consequently have to be moved being comparatively small in comparison herewith. The cost-benefit ratio is particularly good when using three ring magnets in each case.

In one development of the disclosure, provision can be made for the second permanent magnet arrangement to have an axial magnetization.

Even though a radial magnetization of the second permanent magnet arrangement can also be provided in the case of an appropriate adjustment of the arrangement, geometry and magnetization of the magnetic unit, an axial magnetization was found to be advantageous since the manufacturing costs or the manufacturing outlay of an axially magnetized ring magnet is lower than for a radially magnetized ring magnet.

Moreover, in one development of the disclosure, provision can be made for the second permanent magnet arrangement to include a plurality of ring magnets, preferably two ring magnets, which are arranged axially above one another.

The ring magnets arranged axially above one another can be connected to one another in interlocking, force-fit and/or cohesive fashion. However, the ring magnets of the second permanent magnet arrangement are preferably arranged above one another in a manner spaced apart from one another.

In one development, provision can be made for the second permanent magnet arrangement to include two axially magnetized ring magnets, which are aligned with respect to one another with identical polarity and therefore magnetically repel one another.

Simulations have shown that such a configuration and alignment of the second permanent magnet arrangement is particularly advantageous for reducing the magnetic stray field.

In one development, provision can moreover be made for the radially outer ring magnet of the first permanent magnet arrangement to have an axial polarization, the alignment of which corresponds to the polarization of the ring magnet of the second permanent magnet arrangement that is adjacent to the third permanent magnet arrangement.

That is to say, the axial polarization or axial alignment and arrangement of the magnetic poles of the lowest ring magnet along the movement direction of the second permanent magnet arrangement can preferably correspond to the magnetic polarization of the outermost ring magnet of the first permanent magnet arrangement.

Thus, for example, if the radially outermost ring magnet of the first permanent magnet arrangement is aligned in such a way that its first magnetic pole (e.g., the north pole) is arranged further down along the movement direction than its second magnetic pole (e.g., the south pole), the lowest ring magnet along the movement direction of the second permanent magnet arrangement can have the same alignment of the magnetic poles.

In one development of the disclosure, provision can be made for the axial extent of the second permanent magnet arrangement to be greater than or equal to an axial spacing between the third permanent magnet arrangement and the magnetic body arrangement.

However, the axial extent of the second permanent magnet arrangement can also be smaller than the axial spacing between the third permanent magnet arrangement and the magnetic body arrangement. The inventors have recognized that the magnetic shielding is greatest or the stray field generated by the weight compensating device is lowest when the axial extent of the second permanent magnet arrangement substantially corresponds to the axial spacing between the third permanent magnet arrangement and the magnetic body arrangement. Further, this also allows an optimization of the compensating force to be generated.

Finally, in one development of the disclosure, provision can be made for the axial spacing between the ring magnets of the second permanent magnet arrangement, the spacing between the third permanent magnet arrangement and the magnetic body arrangement and/or the axial position along the movement axis of the first permanent magnet arrangement, the second permanent magnet arrangement, the third permanent magnet arrangement and/or the magnetic body arrangement to be adjustable in order to set the compensating force.

Typically, many different optical components, usually mirrors, with different geometries are involved within an optical module of a projection exposure apparatus, said components placing different demands on the weight compensating device. By way of example, mirrors of an EUV projection exposure apparatus partly have an asymmetric embodiment, leading to different desired compensation properties. Consequently, a plurality of weight compensating devices are involved, wherein all weight compensating devices usually have to compensate (slightly) deviating weights. Further, the compensating force generated by the weight compensating device can change over time, for example on account of an aging-dictated decrease in the magnetic forces or on account of thermal effects. Moreover, the involved compensating force may vary depending on the location of the projection exposure apparatus.

Therefore, the weight that is not ideally compensated on account of changed desired properties or on account of standardized weight compensating devices are desirably compensated via the (plunger coil) actuators, leading to a continuous additional current in the actuator coil or coils. The consequently increased current results in an unwanted development of heat, with potentially negative consequences for the positioning of the corresponding component or mirror.

In order to avoid this issue, an adjustment of the weight compensating device or of the magnetic unit may be advantageous. By way of example, the positions of permanent magnets, of permanent magnet arrangements and/or of the magnetic body arrangement can be set by way of threads and/or spacer rings.

In one development of the disclosure, provision can moreover be made for a Halbach arrangement (also referred to as Halbach array) to be provided in the first permanent magnet arrangement, the third permanent magnet arrangement and/or the magnetic body arrangement. Optionally, a Halbach arrangement may also be provided in the second permanent magnet arrangement.

A Halbach arrangement can increase the performance of the weight compensating device. To this end, provision can be made, for example, of radially magnetized ring magnets between axially magnetized ring magnets of the first permanent magnet arrangement, the second permanent magnet arrangement, the third permanent magnet arrangement and/or the magnetic body arrangement. In particular, a Halbach arrangement with two radially magnetized ring magnets can be provided for a permanent magnet arrangement including three axially magnetized ring magnets in each case, with the radially magnetized ring magnets of the Halbach arrangement preferably being aligned with opposite polarity with respect to one another. The two radially magnetized ring magnets are preferably arranged between two axially magnetized ring magnets in each case, with respectively one axially magnetized ring magnet being arranged between the radially magnetized ring magnets. Preferably, the magnetization of the radially magnetized ring magnets and the arrangement of the radially magnetized ring magnets is identical for the purposes of forming the Halbach arrangement in the first permanent magnet arrangement, the third permanent magnet arrangement and/or the magnetic body arrangement. Preferably, a total of two Halbach arrangements are provided, wherein either respectively one Halbach arrangement can be arranged in the first permanent magnet arrangement and in the third permanent magnet arrangement or respectively one Halbach arrangement can be arranged in the first permanent magnet arrangement and in the fourth permanent magnet arrangement. In principle, it may be advantageous to always equip two permanent magnet arrangements that adjoin one another with Halbach arrangements.

The complexity of the magnetic circuit but also the efficiency thereof may be increased by the use of a Halbach arrangement. It may be desirable to take account of the influence of the second permanent magnet arrangement if a Halbach arrangement is used and to match the alignment and/or polarization of individual ring magnets thereto.

In one development of the disclosure, at least one actuator coil can be arranged at the stator, said actuator coil, in conjunction with the first permanent magnet arrangement, forming an actuator for deflecting the translator.

A further advantage of the disclosure is that the described weight compensating device is easily combinable with an actuator, more particularly a plunger coil actuator. Preferably, one or more ring coils can be arranged on the stator in this case, i.e., on a stationary housing part of the weight compensating device. As a consequence, there is not only a magnetic interaction between the permanent magnet arrangements and the magnetic body arrangement but also between the at least one coil and the first permanent magnet arrangement of the translator. Consequently, the interaction between the at least one coil and the first permanent magnet arrangement can be used for the targeted deflection of the translator.

In a particular embodiment of the disclosure, provision can be made for a plurality of magnetic units, which together form the compensating force, to be formed at the stator and at the translator along the movement axis.

Thus, a plurality of first permanent magnet arrangements, second permanent magnet arrangements, third permanent magnet arrangements and/or magnetic body arrangements can be provided in each case, preferably in each case in an arrangement or alignment or grouping, as described above, as individual magnetic units.

The inventors have recognized that the stray field can be further improved if use is made of a plurality of small magnetic units since a plurality of closed magnetic circuits form as a result thereof.

By way of example, provision can be made of two, preferably three, or else, e.g., four, five, six or more magnetic units according to the disclosure.

The formation of a plurality of magnetic units, in particular a plurality of small magnetic units in place of a large or strong magnetic unit, can also be advantageous for the use with weight compensating devices, as is already known. In particular, this also applies to the weight compensating devices, which are presented in the introductory part of the description of this disclosure and in FIG. 4, which is yet to be described below. An improvement or reduction in the stray field as a result of an arrangement of a plurality of magnetic units or individual small magnetic circuits distributed axially along the movement axis may thus generally be advantageous. In principle, a multiple arrangement can generate a lower stray field in the case of a similar force-distance curve and a similar stiffness. Consequently, the weight compensating device may include, e.g., permanent magnet arrangements that are already known but are provided multiple times, e.g., two times, three times, four times, five times, six times or more often, along the movement axis.

Provision can be made for three weight compensating devices to be arranged at an optical element of a projection exposure apparatus, more particularly a mirror. As a result, the optical element can be held virtually force-free, wherein a manipulation of the optical element can be implemented by up to six actuators—preferably one actuator for each degree of freedom. As a consequence, the weights need not be taken up by the actuators but can be compensated advantageously and without electric current by the weight compensating device.

Provision can be made for the permanent magnets of at least one permanent magnet arrangement to be formed from a samarium cobalt alloy or neodymium alloy. A samarium cobalt alloy is particularly preferred on account of the better temperature and long-term behavior.

The disclosure also relates to a projection exposure apparatus for semiconductor lithography, including an illumination system including a radiation source and an optical unit including at least one optical element, wherein provision is made of weight compensating devices for compensating the weight of at least one of the optical elements. Here, according to the disclosure, at least one of the weight compensating devices is embodied according to the explanations made above.

Features and advantages that have already been described in connection with the above-described method according to the disclosure or the weight compensating device according to the disclosure may also be used in any desired combination in the case of the projection exposure apparatus.

Reference is made to the fact that terms such as "including", "having" or "with" do not exclude other features. Further, terms such as "one" or "the" which indicate single features do not preclude a plurality of features.

Exemplary embodiments of the disclosure are described in greater detail below with reference to the drawing.

The figures in each case show preferred exemplary embodiments in which individual features of the present disclosure are illustrated in combination with one another. Features of an exemplary embodiment are also able to be implemented independently of the other features of the same exemplary embodiment, and may readily be combined accordingly by a person skilled in the art to form further expedient combinations and sub-combinations with features of other exemplary embodiments.

BRIEF DESCRIPTION OF THE FIGURES

In the figures, functionally identical elements are provided with the same reference signs. In the figures, schematically.

DESCRIPTION OF EXEMPLARY EMBODIMENTS

Figure 1:
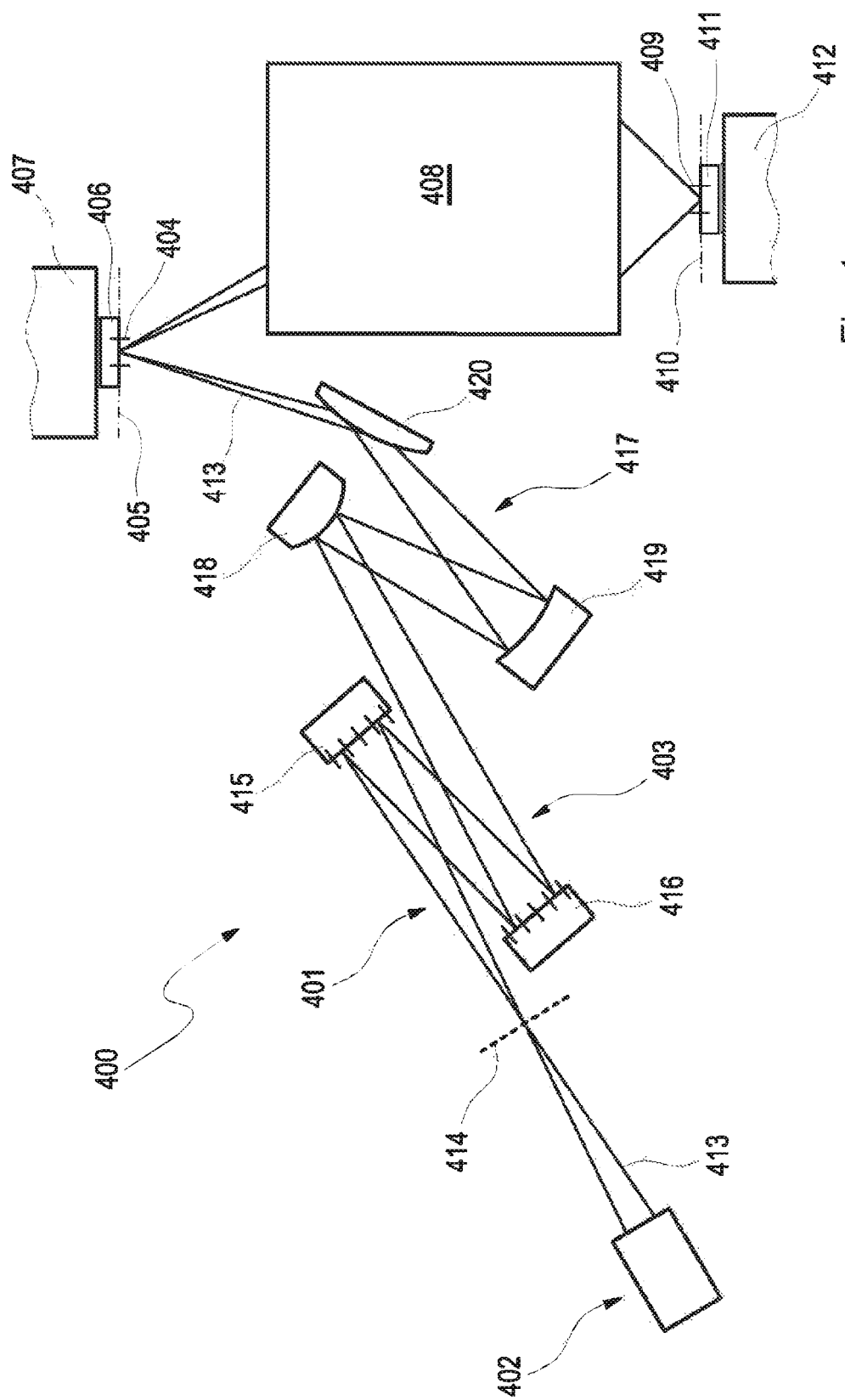
FIG. 1 shows an EUV projection exposure apparatus.

FIG. 1 shows by way of example the basic structure of an EUV projection exposure apparatus 400 for semiconductor lithography in which the disclosure is able to be applied. An illumination system 401 of the projection exposure apparatus 400 includes, besides a radiation source 402, an optical unit 403 for the illumination of an object field 404 in an object plane 405. A reticle 406 arranged in the object field 404 is illuminated, said reticle being held by a reticle holder 407, illustrated schematically. A projection optical unit 408, illustrated merely schematically, serves for imaging the object field 404 into an image field 409 in an image plane 410. A structure on the reticle 406 is imaged on a light-sensitive layer of a wafer 411 arranged in the region of the image field 409 in the image plane 410, said wafer being held by a wafer holder 412 that is likewise illustrated in part. The radiation source 402 can emit EUV radiation 413, in particular in the range of between 5 nanometers and 30 nanometers. Optically differently designed and mechanically adjustable optical elements 415, 416, 418, 419 and 420 are used for controlling the radiation path of the EUV radiation 413. In the case of the EUV projection exposure apparatus 400 illustrated in FIG. 1, the optical elements are designed as adjustable mirrors in suitable embodiments, which are mentioned merely by way of example below.

The EUV radiation 413 generated via the radiation source 402 is aligned via a collector integrated in the radiation source 402 in such a way that the EUV radiation 413 passes through an intermediate focus in the region of an intermediate focal plane 414 before the EUV radiation 413 impinges on a field facet mirror 415. Downstream of the field facet mirror 415, the EUV radiation 413 is reflected by a pupil facet mirror 416. With the aid of the pupil facet mirror 416 and an optical assembly 417 having mirrors 418, 419 and 420, field facets of the field facet mirror 415 are imaged into the object field 404.

Figure 2:
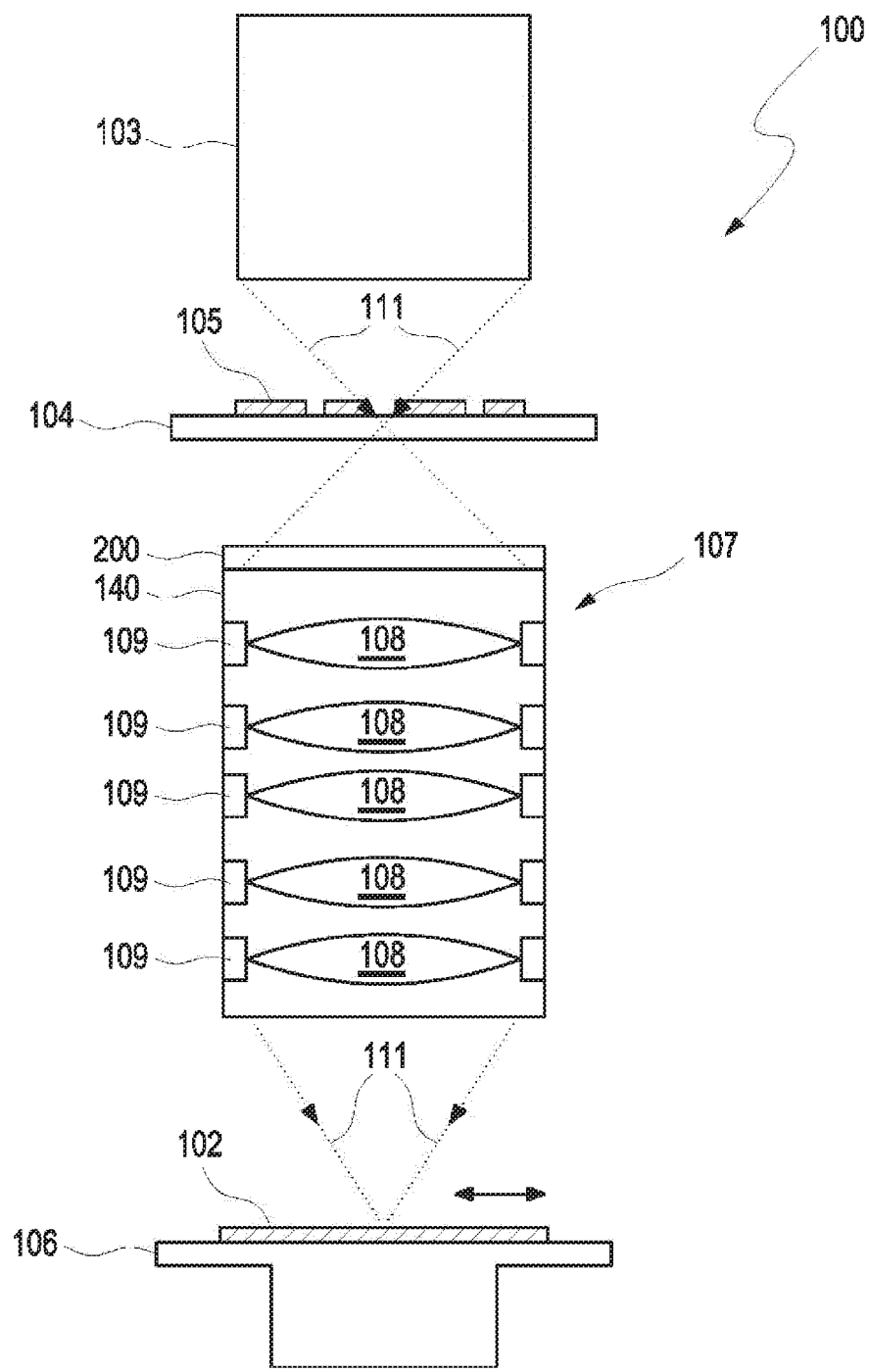
FIG. 2 shows a further projection exposure apparatus.

FIG. 2 illustrates a further projection exposure apparatus 100, for example a DUV ("deep ultraviolet") projection exposure apparatus. The projection exposure apparatus 100 includes an illumination system 103, a device known as a reticle stage 104 for receiving and exactly positioning a reticle 105, by which the later structures on a wafer 102 are determined, a facility 106 for holding, moving and exactly positioning the wafer 102 and an imaging facility, to be specific a projection lens 107, with multiple optical elements 108, which are held by way of mounts 109 in a lens housing 140 of the projection lens 107.

The optical elements 108 may be designed as individual refractive, diffractive and/or reflective optical elements 108, such as for example lens elements, mirrors, prisms, terminating plates and the like.

The basic functional principle of the projection exposure apparatus 100 makes provision for the structures introduced into the reticle 105 to be imaged onto the wafer 102.

The illumination system 103 provides a projection beam 111 in the form of electromagnetic radiation, which is involved for the imaging of the reticle 105 on the wafer 102. A laser, plasma source or the like may be used as the source of this radiation. Optical elements in the illumination system 103 are used to shape the radiation in such a way that, when it is incident on the reticle 105, the projection beam 111 has the desired properties with regard to diameter, polarization, shape of the wavefront and the like.

An image of the reticle 105 is generated via the projection beam 111 and transferred from the projection lens 107 onto the wafer 102 in an appropriately reduced form. In this case, the reticle 105 and the wafer 102 may be moved synchronously, so that regions of the reticle 105 are imaged onto corresponding regions of the wafer 102 virtually continuously during a so-called scanning operation.

FIG. 2 shows the arrangement of a manipulator 200 in the region between the reticle stage 104 and the first optical element 108 of the projection lens 107. The manipulator 200 serves for correcting image aberrations, wherein an optical element that is contained is mechanically deformed by an actuator system.

The use of actuators of various designs is known for adjusting and/or for manipulating the optical elements 415, 416, 418, 419, 420, 108 of the projection exposure apparatuses 400, 100 illustrated in FIGS. 1 and 2 and the wafers 411, 102.

The apparatus according to the disclosure is particularly suitable for compensating the weight of the individual optical elements 108, 418, 419, 420, parts of these optical elements 108, 418, 419, 420 or any other optical elements of a projection exposure apparatus 400, 100.

The use of the disclosure is not restricted to use in projection exposure apparatuses 100, 400, in particular also not with the described structure.

The disclosure and the following exemplary embodiment should also not be understood as being restricted to a specific design.

Figure 3:
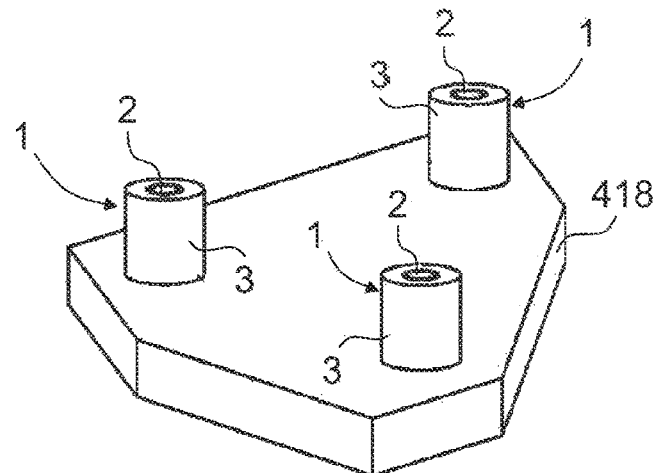
FIG. 3 shows an isometric illustration of an optical element with three weight compensating devices.

FIG. 3 shows a very schematic, isometric view of an optical element, for example a mirror 418, of a projection exposure apparatus 400. However, the arrangement can be used for all optical elements of any projection exposure apparatus. The arrangement includes three weight compensating devices 1 on the back side of the mirror 418. A respective weight compensating device 1 includes a translator 2. The translator 2 is exemplary embodiment embodied as a tubular element that is arranged within a stator 3. The translator 2 transfers the compensating force $F_M$ to the mirror 418. The stator 3 can be secured on a supporting frame (not shown) of the projection exposure apparatus 400.

Further, a deflection of the mirror 418 by actuators, more particularly plunger coil actuators, may be provided. The plunger coil actuators (not denoted in any more detail) may be embodied in combination with the weight compensating devices 1 in this case.

Figure 4:
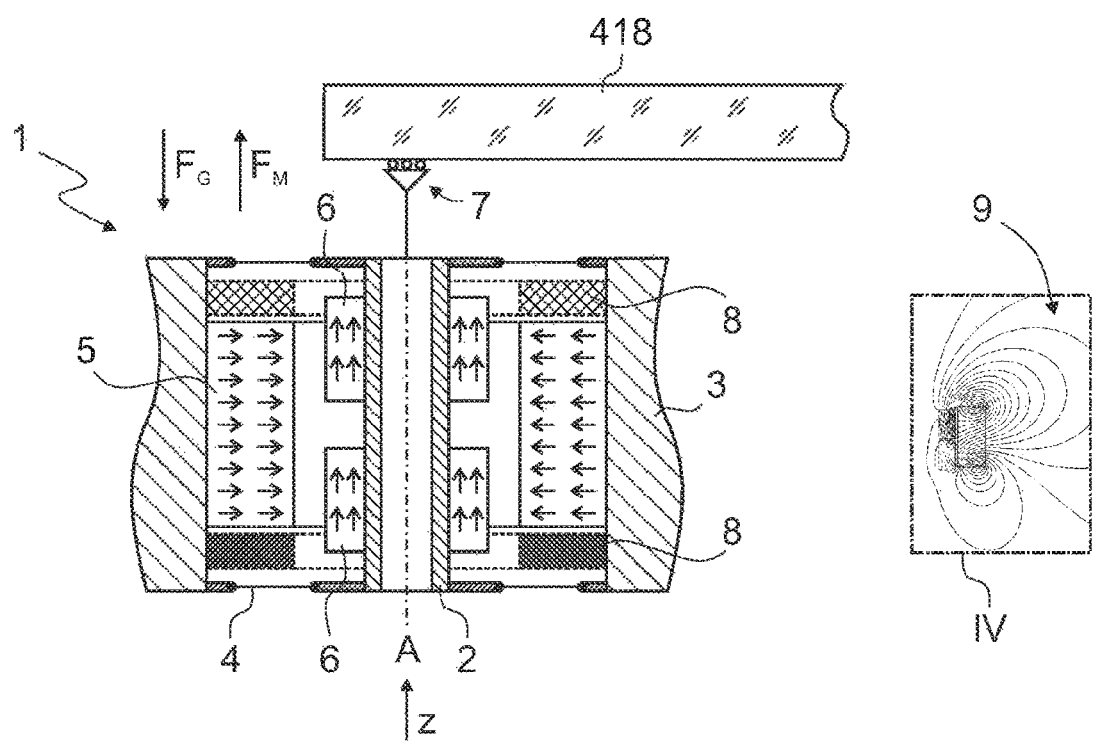
FIG. 4 shows an arrangement for holding an optical element with a weight compensating device in a non-deflected position, according to the prior art.

FIG. 4 shows a schematic sectional view of a weight compensating device 1 of FIG. 3 according to the prior art. The weight compensating device 1 is constructed rotationally symmetrical with respect to a movement axis A. The translator 2 of the weight compensating device 1 extends along the movement axis A. Here, the translator 2 is connected via connecting elements 4 to the surrounding stator 3 such that the translator 2 is positively guided along the movement axis A. The direction of the movement axis A is likewise the direction in which the weight compensating device 1 exerts the compensating force $F_M$ on the mirror 418 in the movement direction z in order to hold said mirror 418.

The weight compensating device 1 according to the prior art includes a radially magnetized ring magnet 5 and two axially magnetized ring magnets 6. Here, in the figures, the magnetization direction or the polarization or the alignment of the magnetic poles is indicated by arrows in each case, with the arrow, proceeding from one of the first magnetic poles, pointing to a second magnetic pole. According to the usual illustration of field lines, the first magnetic pole can be, in particular a magnetic north pole and the second magnetic pole can be a magnetic south pole. However, the relationships can also be interchanged.

The ring magnet 5 that is fastened to the stator 3 surrounds the ring magnets 6 of the translator 2. In the exemplary embodiment, the translator 2 is embodied as a tube. The two axially magnetized ring magnets 2 are arranged around the translator 2 in a manner spaced apart from one another axially, i.e., along the movement axis A. Here, the ring magnets 5, 6 are arranged and magnetized in such a way that the magnetic interaction ensures that the two axially magnetized ring magnets 6 are pressed out of the radially magnetized ring magnet 5 along the movement axis A (upward in the illustration).

The translator 2 is connected to the mirror 418 in order to exert the compensating force $F_M$ on the mirror 418. The connection is established by way of a coupling device 7 (merely indicated schematically in FIG. 4) assigned to the weight compensating device 1. The coupling device 7 mounts the mirror 418 in a freely movably fashion in a plane perpendicular to the movement axis A. In the direction of the weight $F_G$, i.e., along the movement axis A, on the other hand, the mirror 418 is held by the weight compensating device 1.

Further, FIG. 4 shows a combination of the weight compensating device 1 with an actuator embodied as a plunger coil actuator.

To this end, two actuator coils 8 (illustrated only schematically and in dashed fashion as blocks) are provided on the stator 3, said actuator coils causing a magnetic interaction with the axially magnetized ring magnets 6 of the translator 2 in the case of an appropriate current feed, as a result of which the translator 2 can be deflected in targeted fashion. As a result of the weight $F_G$ of the mirror 418—as described—already having been compensated, the actuator need not compensate the weight $F_G$ by way of an additional current feed to the actuator coils 8. Therefore, the arrangement has a high efficiency and, in particular, low thermal emissions.

However, the disclosure can also be used for a weight compensating device 1 that includes no additional actuator or no actuator coils 8.

The arrangement of the prior art described above has the disadvantage of a relatively large stray field 9, which may possibly adversely affect adjacent component parts, for example of a projection exposure apparatus 100, 400. By way of example, sensors and actuators and adjoining electronics can be adversely affected by the stray field or fields 9 emanating from the weight compensating device 1. In order to elucidate the issue, FIG. 4 shows a schematic illustration of the distribution of the magnetic field lines of such an arrangement in the image field IV. Here, all that is shown for simplification purposes is the stray field 9 of the right-hand part of the rotationally symmetric arrangement.

Figure 5A:
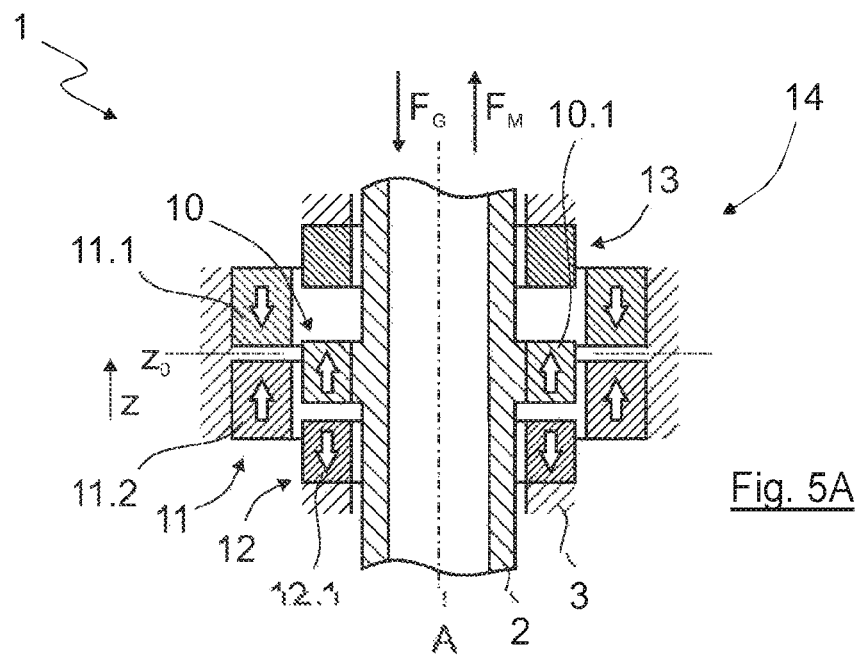
FIG. 5A shows a first embodiment of a weight compensating device according to the disclosure in a deflected position.
Figure 5B:
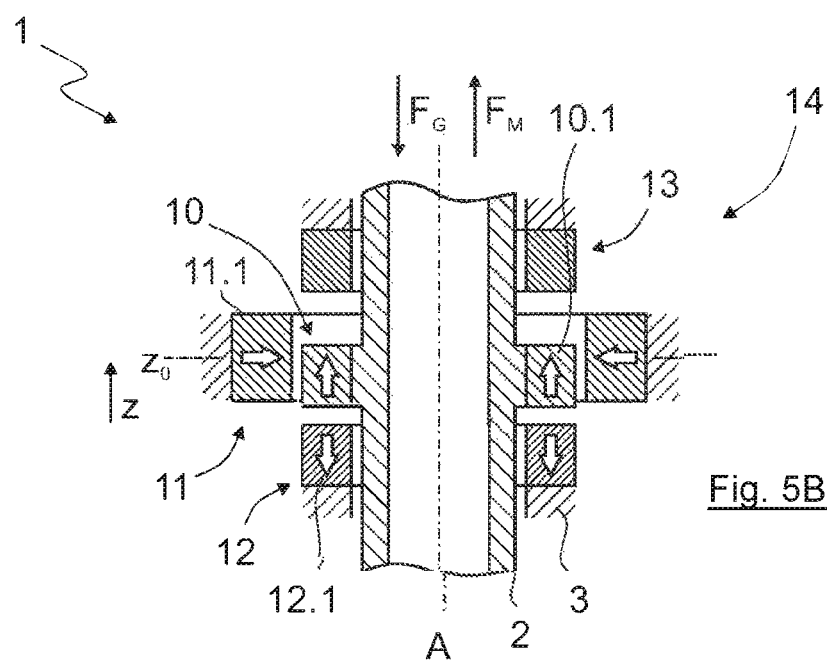
FIG. 5B shows a variant of the first embodiment of FIG. 5A with a radially magnetized second permanent magnet arrangement.

FIG. 5A shows a first embodiment of the weight compensating device 1 according to the disclosure and FIG. 5B shows a variant thereof. Here, this is a minimalist embodiment of the disclosure. For reasons of clarity and an improved illustration, all that is shown is a section that represents the arrangement along the stator 3 and the translator 2. The basic structure, i.e., the connection of the translator 2 to the component 418 to be mounted, etc., can correspond as a matter of principle to the known prior art (cf. FIG. 4) and will not be described again in detail.

According to the disclosure, provision is made for the translator 2 to be movable relative to the stator 3 along the movement axis A, as is already known from the prior art. For elucidation purposes, the figures illustrate a clearly visible play between the translator 2 and the surrounding stationary components arranged on the stator 3. The translator 2 includes a first permanent magnet arrangement 10 with an axial magnetization. Further, the stator 3 includes a second permanent magnet arrangement 11, which radially surrounds the first permanent magnet arrangement 10.

According to the disclosure, provision is further made of a third permanent magnet arrangement 12 that is arranged coaxially below the first permanent magnet arrangement 10 and that has an axial magnetization that is aligned in inverse fashion with respect to the axial magnetization of the first permanent magnet arrangement 10. Finally, the stator 3 includes a magnetic body arrangement 13, which is arranged coaxially above the first permanent magnet arrangement 10.

The first permanent magnet arrangement 10, the second permanent magnet arrangement 11, the third permanent magnet arrangement 12 and the magnetic body arrangement 13 form a magnetic unit 14 and, in interaction with one another, generate a compensating force $F_M$, which counteracts the weight $F_G$ acting on the translator 2.

Figure 6:
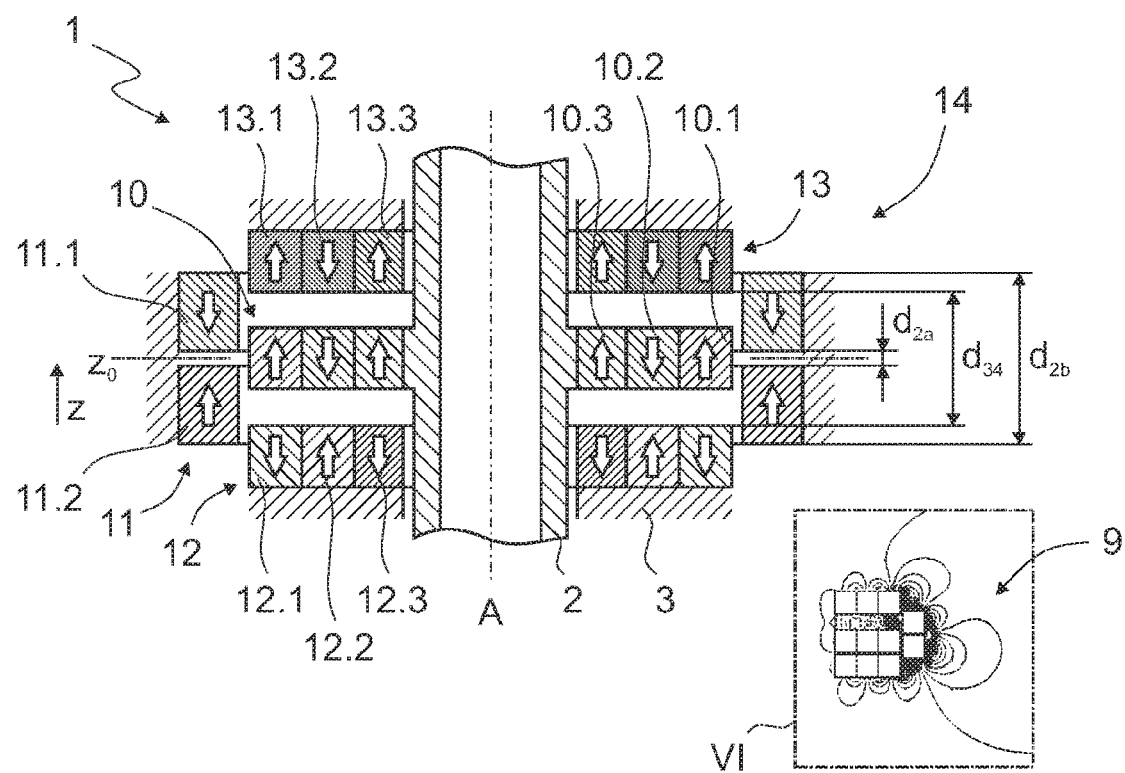
FIG. 6 shows a second embodiment of the weight compensating device according to the disclosure in a non-deflected position.
Figure 7:
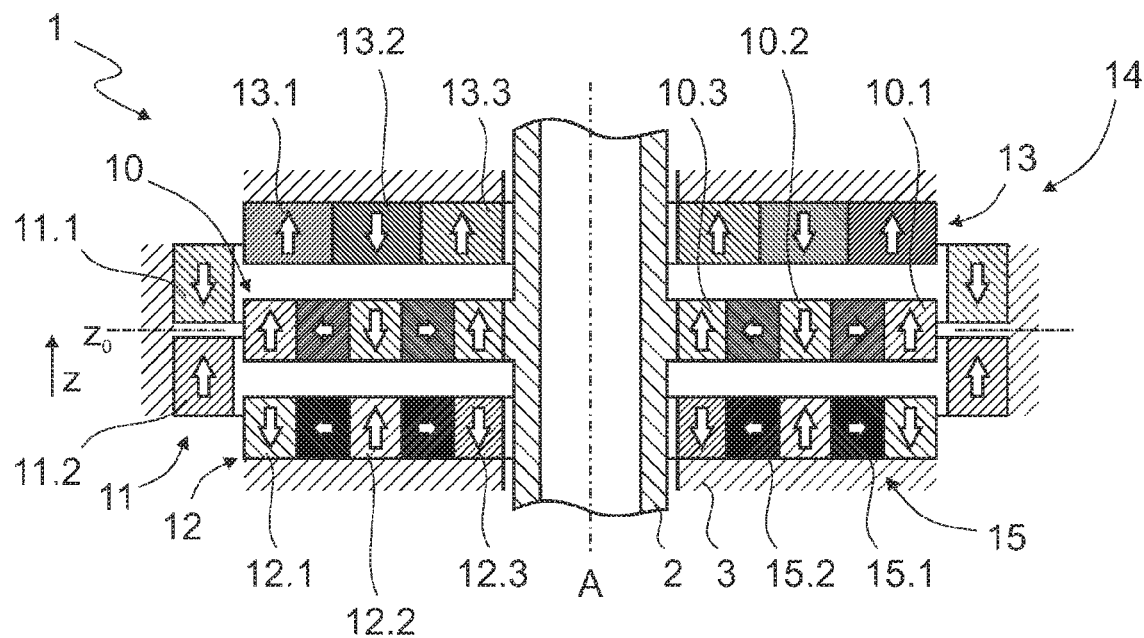
FIG. 7 shows a third embodiment of the weight compensating device according to the disclosure with a Halbach arrangement in a non-deflected position.

FIGS. 5 to 7 each indicate a force-free central position $z_0$ or zero position, in which the first permanent magnet arrangement 10 is aligned in centered fashion between the third permanent magnet arrangement 12 and the magnetic body arrangement 13. In FIGS. 5A, 5B, the translator 2 is deflected from its central position $z_0$ for clarification purposes (illustrated in exaggerated fashion for elucidation purposes).

The first permanent magnet arrangement 10 and the third permanent magnet arrangement 12 are each formed from an axially magnetized ring magnet 10.1, 12.1 in the exemplary embodiment according to FIGS. 5A-5B. Here, the ring magnets 10.1, 12.1 of the first and third permanent magnet arrangement 10, 12 are magnetized with opposite polarity in relation to one another, i.e., the ring magnets 10.1, 12.1, magnetically repel one another.

In the embodiment of FIG. 5A-5B, the magnetic body arrangement 13 is a soft magnetic annular body 13, in particular made of iron.

As a result of this arrangement, an interaction arises within the magnetic unit 14 such that the first permanent magnet arrangement 10, which is fastened to the translator 2, is magnetically repelled by the third permanent magnet arrangement 12 arranged therebelow and simultaneously magnetically attracted by the magnetic body arrangement 13.

The second permanent magnet arrangement 11 likewise has an axial magnetization in the exemplary embodiment according to FIG. 5A. To this end, the second permanent magnet arrangement 11 includes two axially polarized ring magnets 11.1, 11.2 that are arranged axially above one another. The two ring magnets 11.1, 11.2 of the second permanent magnet arrangement 11 have an alignment with respect to one another with the same polarization in this case, i.e., their magnetic south poles (or, alternatively, their magnetic north poles) are aligned with respect to one another.

Like above, the alignment of the magnetic poles in FIGS. 5A, 5B and in the subsequent figures is also represented by arrows in the respective individual magnetic component parts.

Consequently, the ring magnets 11.1, 11.2 of the second permanent magnet arrangement 11 in the exemplary embodiment of FIG. 5A exert a magnetically repulsive force on one another.

In principle, the axial magnetization (FIG. 5A) of the second permanent magnet arrangement 11 can be as desired; however, the inventors have recognized that an advantageous result, in particular also a stray field-optimized result, is obtained from, in particular, two axially magnetized ring magnets 11.1, 11.2 with a polarization aligned with opposite polarity with respect to one another. In particular, this applies if a radially outermost ring magnet 10.1 of the first permanent magnet arrangement 10 has an axial polarization, the alignment of which corresponds to the polarization of the lowermost ring magnet 11.2 of the second permanent magnet arrangement 11 that is adjacent to the third permanent magnet arrangement 12.

However, provision can alternatively also be made for the second permanent magnet arrangement 11 to be radially magnetized, as illustrated in FIG. 5B. In FIG. 5B, the second permanent magnet arrangement 11 is formed from a single, radially magnetized ring magnet 11.1. Here, the dimensions of the ring magnet 11.1 can be determined by simulations and/or calculations and are only illustrated in exemplary fashion in FIG. 5B. Further, the radial magnetization of the ring magnet 11.1 can also be set with opposite polarity to the magnetization illustrated in FIG. 5B. Provision can also be made of a plurality of radially magnetized ring magnets—or of combinations of radially and axially magnetized ring magnets. In the subsequent figures, the second permanent magnet arrangement 11 always has the same embodiment as in the exemplary embodiment of FIG. 5A—however, this should not be construed as a restriction. In principle, the second permanent magnet arrangement 11 of all subsequent exemplary embodiments may also be radially magnetized, for example, as illustrated in FIG. 5B.

Small, closed magnetic circuits are formed by the magnetic unit 14 illustrated in FIGS. 5A, 5B. Only a small stray field 9 is emitted for this reason, wherein a force-distance curve that is suitable for weight compensation can be provided at the same time.

A weight compensating device 1 that is further improved in respect of the magnetic shielding and the force-distance curve is illustrated in FIG. 6.

Here, the magnetic body arrangement 13 is embodied as a fourth permanent magnet arrangement 13, which has an axial magnetization that is formed in accordance with the axial magnetization of the first permanent magnet arrangement 10. Consequently, the magnetization of the first permanent magnet arrangement 10 and the magnetization of the fourth permanent magnet arrangement 13 are chosen in such a way that the first permanent magnet arrangement 10 and the fourth permanent magnet arrangement 13 magnetically attract.

Below, the magnetic body arrangement 13 is always illustrated as a fourth permanent magnet arrangement 13, wherein, within the scope of the disclosure, provision can furthermore also be made for not only permanent magnets to be (exclusively) provided but (also) for magnetic bodies, for example made of a soft iron, to be provided in the fourth permanent magnet arrangement 13.

In this embodiment, the first permanent magnet arrangement 10 is formed from three nested axially magnetized ring magnets 10.1, 10.2, 10.3. In a manner analogous thereto, the third permanent magnet arrangement 12 is formed from three ring magnets 12.1, 12.2, 12.3 and the fourth permanent magnet arrangement 13 is formed from three ring magnets 13.1, 13.2, 13.3.

In principle, provision can be made of any number of ring magnets, more particularly nested ring magnets, for example two to ten ring magnets, preferably three to five ring magnets, and very particularly preferably the respective three ring magnets 10.1, 10.2, 10.3, 12.1, 12.2, 12.3, 13.1, 13.2, 13.3 illustrated in the exemplary embodiment.

The inventors have recognized that an even flatter force-distance curve or even less stiffness can be provided by using a fourth permanent magnet arrangement 13 than if use is made of a soft-magnetic material.

The mutually adjacent ring magnets 10.1 and 10.2, and 10.2 and 10.3, of the first permanent magnet arrangement 10 are each polarized or aligned with axially opposite polarity. Here, the first permanent magnet arrangement 10 has an axial magnetization in which the innermost ring magnet 10.3 is polarized in the direction of the compensating force $F_M$, the central ring magnet 10.2 is polarized counter to the compensating force $F_M$ and the outer ring magnet 10.3 is, once again, polarized in the direction of the compensating force $F_M$. The ring magnets 12.1, 12.2, 12.3 of the third permanent magnet arrangement 12, situated therebelow, are magnetized in inverse fashion in relation thereto and the fourth permanent magnet arrangement 13, arranged above the first permanent magnet arrangement 10, is magnetized in corresponding or analogous fashion in relation thereto.

The first permanent magnet arrangement 10, the third permanent magnet arrangement 12 and the fourth permanent magnet arrangement 13 extend in a radial plane, in each case orthogonal and symmetric with respect to the movement axis A, and accordingly extend in plane parallel fashion with respect to one another. Further, the nested ring magnets of the corresponding permanent magnet arrangements 10, 12, 13 are each arranged at the same axial position along the movement axis A. Finally, the number, dimensions (apart from the radial dimensions), i.e., more particularly the cross-sectional area, and structure of the ring magnets 10.1, 10.2, 10.3, 12.1, 12.2, 12.3, 13.1, 13.2, 13.3 of the first, third and fourth permanent magnet arrangement 10, 12, 13 are identical. This can be advantageous from a manufacturing point of view since a modular kit of ring magnets can be provided as a result thereof.

Further, FIG. 6 illustrates a few geometric specifications, which preferably can be used to tune the magnetic unit 14. Here, it is possible to identify that the axial extent $d_{2b}$ of the second permanent magnet arrangement 11, i.e., of the two ring magnets 11.1, 11.2 arranged axially with respect to one another, is slightly larger than the axial spacing $d_{34}$ between the third permanent magnet arrangement 12 and the fourth permanent magnet arrangement 13. However, a structure in which the axial extent $d_{2b}$ of the second permanent magnet arrangement 11 is equal to or smaller than the axial spacing $d_{34}$ between the third permanent magnet arrangement 12 and the fourth permanent magnet arrangement 13 is also possible.

For the purposes of facilitating an adjustment of the weight compensating device 1, provision can be made for the axial spacing $d_{2a}$ between the ring magnets 11.1, 11.2 of the second permanent magnet arrangement 11, the spacing $d_{34}$ between the third permanent magnet arrangement 12 and the permanent magnet arrangement 13 and/or the axial position along the movement axis A of the first, second, third and/or fourth permanent magnet arrangement 10, 11, 12, 13 to be adjustable, as a result of which the compensating force $F_M$ can be adapted.

In order to elucidate the improved properties in respect of a reduced stray field 9, FIG. 6 illustrates a further schematic illustration of a characteristic profile in the image field VI. Here, in a manner analogous to the illustration in FIG. 4, only the right-hand part of the rotationally symmetric arrangement has been imaged. It is possible to identify that the magnetic unit 14 forms smaller, closed magnetic circuits than the magnetic arrangement of the prior art. As a result of this, the magnetic field lines or the stray field 9 are/is (at least substantially) restricted to the magnetic unit 14 itself.

Optionally, the magnetic field of the magnetic unit 14 or the magnetic circuit can be further improved or focused by virtue of using a Halbach arrangement 15. This is depicted in an exemplary manner in FIG. 7. Here, in principle, FIG. 7 shows a weight compensating device 1 which, in respect of the axially magnetized ring magnets 10.1, 10.2, 10.3, 11.1, 11.2, 12.1, 12.2, 12.3, 13.1, 13.2, 13.3, is constructed like the embodiment illustrated in FIG. 6. However, for the purposes of focusing the magnetic field, respectively two radially magnetized ring magnets 15.1, 15.2 for embodying a Halbach arrangement, known in principle, are provided between the respective three axially magnetized ring magnets 10.1, 10.2, 10.3, 12.1, 12.2, 12.3 of the first and third permanent magnet arrangements 10, 12.

Alternatively (not illustrated), provision can also be made for respectively one Halbach arrangement between the ring magnets 10.1, 10.2, 10.3 of the first permanent magnet arrangement 10 and the ring magnets 13.1, 13.2, 13.3 of the fourth permanent magnet arrangement 13.

Since Halbach arrangements are preferably not provided simultaneously in all inner permanent magnet arrangements 10, 12, 13, but always only in two adjacent permanent magnet arrangements or in a pair of permanent magnet arrangements, the position or alignment and/or dimensions of the ring magnets of the permanent magnet arrangement not equipped with a Halbach arrangement can be adapted accordingly. To this end, the ring magnets 13.1, 13.2, 13.3 of the fourth permanent magnet arrangement 13 are enlarged in the exemplary embodiment of FIG. 7, wherein gaps have been avoided between the ring magnets 13.1, 13.2, 13.3. As an alternative and/or in addition to an enlargement, provision can be made of dummy elements between the ring magnets 13.1, 13.2, 13.3, wherein the dummy elements can preferably includes a non-magnetic substance, e.g., a plastic. However, the dummy elements can also include a magnetic substance, e.g., iron. By way of example, the dummy elements can be embodied and/or positioned in such a way that the ring magnets of the inner permanent magnet arrangements 10, 12, 13 may remain unchanged in terms of their dimensions. Simulations and calculations may serve to optimize the magnetic circuit and to select the dummy elements or determine position and/or dimensions of the ring magnets of the permanent magnet arrangement not equipped with a Halbach arrangement. Optionally, the dummy elements can also be dispensed with, i.e., air or a gas, a liquid or a vacuum may also be situated between possible gaps in the ring magnets.

Figure 8:
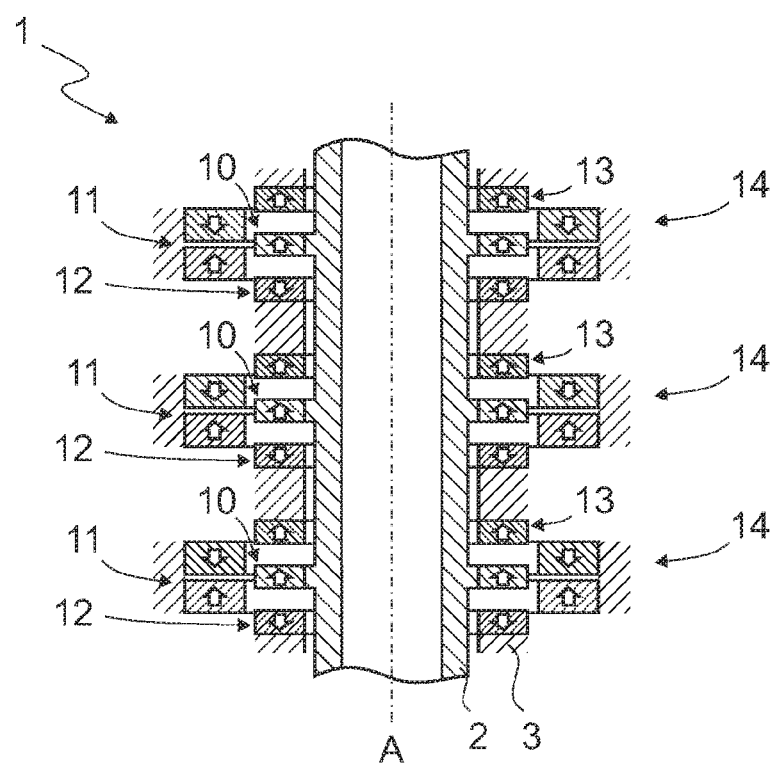
FIG. 8 shows a weight compensating device according to the disclosure with three magnetic units arranged with axial offset along the movement axis.

A further improvement in the stray field 9 can also be achieved by virtue of the weight compensating device 1 providing a plurality of magnetic units 14. This is depicted in an exemplary manner in FIG. 8. Here, FIG. 8 illustrates a weight compensating device 1 including three magnetic units 14 which substantially correspond to the embodiment in FIG. 5A in terms of their structure, wherein, however, the magnetic body arrangement 13 of FIG. 5A is embodied as a fourth permanent magnet arrangement 13 with a ring magnet 13.1.

The individual, smaller magnetic units 14 overall form the compensating force $F_M$, which counteracts the weight $F_G$ acting on the translator 2. Since each of the individual component parts of the magnetic units 14 can have a smaller embodiment as the compensating force $F_M$ is now distributed among a plurality of magnetic units 14, it is possible to obtain a further improved stray field characteristic as the magnetic field lines can short one another more directly or scatter less intensively. In principle, any number of magnetic units 14 can be provided in the weight compensating device 1.

Provision can also be made for a magnetic unit according to the prior art (cf., for example, FIG. 4) to be provided multiple times in a weight compensating device 1 according to the prior art in order to improve the stray field characteristic.

In principle, as already described in relation to the prior art, at least one actuator coil 8 can be arranged at the stator 3 in the weight compensating device 1 according to the disclosure, said actuator coil, in conjunction with the first permanent magnet arrangement 10, forming an actuator for deflecting the translator 2.

Figure 9:
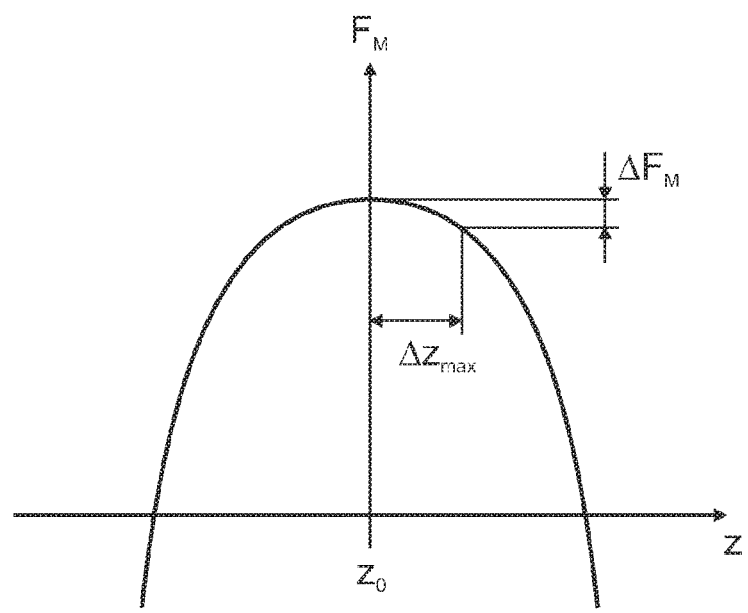
FIG. 9 shows an exemplary force-distance curve.

Finally, FIG. 9 illustrates an exemplary force-distance curve. In principle, the magnetically generated compensating force $F_M$ is dependent on the deflection z of the translator 2 from the zero position $z_0$. In order to be able to compensate the weight $F_G$ relatively ideally over a large range or within an expected deflection range $\Box z_{max}$, the force-distance curve should extend relatively flat and linear within this range of maximum deflection $\Box z_{max}$. It should be possible to neglect, to the greatest reasonable extent, a change in the force $\Box F_M$ over the maximum deflection range $\Box z_{max}$. In FIG. 9 the relationships are illustrated in greatly exaggerated fashion (and hence actually in disadvantageous fashion) for elucidation purposes.

The inventors have recognized that a particularly flat or linear force-distance curve is achievable by a magnetic unit 14 according to the disclosure, particularly when using a fourth permanent magnet arrangement 13. The stiffness of such a weight compensating device 1 can be significantly improved in comparison with the known prior art. At the same time, a weight compensating device 1 according to the disclosure has a small stray field 9 and a simple structure.

What is claimed is:

1. A device, comprising:
    a stator; and
    a translator movable relative to the stator along a movement axis,
    wherein:
        the translator comprises a first permanent magnet arrangement having an axial magnetization;
        the first permanent magnet arrangement comprises an axially magnetized ring magnet;
        the stator comprises a second permanent magnet arrangement radially surrounding the first permanent magnet arrangement;
        the stator comprises a third permanent magnet arrangement coaxial with the first permanent magnet arrangement;
        the third permanent magnet arrangement has an axial magnetization inverse to the axial magnetization of the first permanent magnet arrangement;
        the stator comprises a magnetic body arrangement coaxial to the first permanent magnet arrangement;
        the third permanent magnet is coxially below the first permanent magnet along a direction of a force due to a weight acting on the translator;
        the magnetic body arrangement is coaxially above the first permanent magnet arrangement along the direction of the force due to the weight acting on the translator;
        the first permanent magnet arrangement, the second permanent magnet arrangement, the third permanent magnet arrangement and the magnetic body arrangement define a magnetic unit;
        in interaction with each other, the first permanent magnet arrangement, the second permanent magnet arrangement, the third permanent magnet arrangement and the magnetic body arrangement define a compensating force that counteracts the weight acting on the translator.

2. The device of claim 1, wherein the magnetic body arrangement comprises a fourth permanent magnet arrangement having an axial magnetization aligned with the axial magnetization of the first permanent magnet arrangement.

3. The device of claim 1, wherein:
    the first permanent magnet arrangement extends in a first plane;
    the third permanent magnet arrangement extends in a second plane;
    the magnetic body arrangement extends in a third plane;
    each of the first, second and third planes is orthogonal to the movement axis; and
    each of the first, second and third planes is symmetric with respect to the movement axis.

4. The device of claim 1, wherein at least one member selected from the group consisting of the third permanent magnet arrangement and the magnetic body arrangement comprises an axially magnetized ring magnet.

5. The device of claim 1, wherein at least one member selected from the group consisting of the first permanent magnet arrangement, the third permanent magnet arrangement and the magnetic body arrangement comprises a plurality of nested axially magnetized ring magnets.

6. The device of claim 5, wherein the nested axially magnetized ring magnets are polarized with axially opposite polarity.

7. The device of claim 5, wherein:
the nested axially magnetized ring magnets are in a plane;
the plane is orthogonal to the movement axis; and
the plane is symmetric with respect to the movement axis.

8. The device of claim 1, wherein:
at least one member selected from the group consisting of the first permanent magnet arrangement, the third permanent magnet arrangement and the magnetic body arrangement comprises a plurality of ring magnets; and
for each of the ring magnets, the ring magnet has a central axis that extends coaxially relative to the movement axis.

9. The device of claim 1, wherein at least one member selected from the group consisting of the first permanent magnet arrangement, the third permanent magnet arrangement and the magnetic body arrangement comprises from two ring magnets to 10 ring magnets.

10. The device of claim 1, wherein the second permanent magnet arrangement has an axial magnetization.

11. The device of claim 1, wherein the second permanent magnet arrangement comprises a plurality of ring magnets axially arranged relative to each other.

12. The device of claim 11, wherein the second permanent magnet arrangement comprises two axially magnetized ring magnets aligned with each other with opposite polarity.

13. The device of claim 12, wherein the ring magnet of the first permanent magnet arrangement has an axial polarization aligned with the polarization of one of the magnetized ring magnets of the second permanent magnet arrangement.

14. The device of claim 1, wherein an axial extent of the second permanent magnet arrangement is greater than or equal to an axial spacing between the third permanent magnet arrangement and the magnetic body arrangement.

15. The device of claim 1, wherein at least one of the following holds:
the second permanent magnet arrangement comprises a plurality of magnets, and an axial spacing between the ring magnets of the second permanent magnet arrangement is adjustable to adjust the compensating force;
an axial spacing between the third permanent magnet arrangement and the magnetic body arrangement is adjustable to adjust the compensating force;
an axial position along the movement axis of the first permanent magnet arrangement is adjustable to adjust the compensating force;
an axial position along the movement axis of the second permanent magnet arrangement is adjustable to adjust the compensating force; and
an axial position along the movement axis of the third permanent magnet arrangement is adjustable to adjust the compensating force.

16. The device of claim 1, wherein at least one member selected from the group consisting of the first permanent magnet arrangement, the third permanent magnet arrangement, and the magnetic body arrangement comprises a Halbach arrangement.

17. The device of claim 1, further comprising an actuator coil at the stator, wherein the stator coil and the first permanent magnet arrangement define an actuator configured to deflect the translator.

18. The device of claim 1, further comprising a plurality of magnetic units at the stator and the translator along the movement axis, and the magnetic units define the compensating force.

19. An apparatus, comprising:
an illumination system;
an optical unit comprising an optical element; and
a device according to claim 1,
wherein:
the device is configured to compensate a weight of the optical element; and
the apparatus is a lithography projection exposure apparatus.

20. The apparatus of claim 19, wherein the optical element comprises a mirror.

* * * * *

UNITED STATES PATENT AND TRADEMARK OFFICE
CERTIFICATE OF CORRECTION

| | |
|---|---|
| PATENT NO. | : 11,537,052 B2 |
| APPLICATION NO. | : 16/748119 |
| DATED | : December 27, 2022 |
| INVENTOR(S) | : Michael Erath |

It is certified that error appears in the above-identified patent and that said Letters Patent is hereby corrected as shown below:

In the Specification

Column 2, Line 57, delete "relative" insert --relatively--.

Column 18, Line 3, delete "FIG." insert --FIGS.--.

In the Claims

Column 22, Line 25, Claim 1, delete "coxially" insert --coaxially--.

Signed and Sealed this
Fourteenth Day of February, 2023

*Katherine Kelly Vidal*
*Director of the United States Patent and Trademark Office*